US007871934B2

(12) United States Patent
Dennison et al.

(10) Patent No.: US 7,871,934 B2
(45) Date of Patent: Jan. 18, 2011

(54) METHOD FOR AN INTEGRATED CIRCUIT CONTACT

(75) Inventors: Charles H. Dennison, Meridian, ID (US); Trung T. Doan, Boise, ID (US)

(73) Assignee: Round Rock Research, LLC, Mount Kisco, NY (US)

( * ) Notice: Subject to any disclaimer, the term of this patent is extended or adjusted under 35 U.S.C. 154(b) by 64 days.

(21) Appl. No.: 11/841,906

(22) Filed: Aug. 20, 2007

(65) Prior Publication Data

US 2007/0281487 A1 Dec. 6, 2007

Related U.S. Application Data

(60) Continuation of application No. 10/923,242, filed on Aug. 19, 2004, now Pat. No. 7,276,448, which is a division of application No. 10/136,544, filed on May 1, 2002, now Pat. No. 7,282,440, which is a continuation of application No. 09/569,578, filed on May 10, 2000, now Pat. No. 6,414,392, which is a division of application No. 09/099,047, filed on Jun. 17, 1998, now Pat. No. 6,221,779, which is a continuation of application No. 08/786,482, filed on Jan. 21, 1997, now Pat. No. 5,858,877, which is a continuation of application No. 08/626,651, filed on Apr. 1, 1996, now Pat. No. 5,651,855, which is a continuation of application No. 08/259,187, filed on Jun. 13, 1994, now abandoned, which is a continuation-in-part of application No. 07/921,320, filed on Jul. 28, 1992, now abandoned.

(51) Int. Cl.
*H01L 21/311* (2006.01)

(52) U.S. Cl. ..................................... 438/702

(58) Field of Classification Search ....................... None
See application file for complete search history.

(56) References Cited

U.S. PATENT DOCUMENTS 3,653,898 A 4/1972 Shaw (Continued)

FOREIGN PATENT DOCUMENTS

EP 463365 A2 1/1992

(Continued)

OTHER PUBLICATIONS

IBM Technical Disclosure Bulletin, "Borderless Gate Contact—MO Local Interconnect Technology for Trench Gate MOSFETs," vol. 34, No. 11, pp. 251-254, Apr. 1992.

(Continued)

*Primary Examiner*—Charles D. Garber
*Assistant Examiner*—Andre' C Stevenson
(74) *Attorney, Agent, or Firm*—Lerner, David, Littenberg, Krumholz & Mentlik, LLP

(57) ABSTRACT

A process is provided for forming vertical contacts in the manufacture of integrated circuits and devices. The process eliminates the need for precise mask alignment and allows the etch of the contact hole to be controlled independent of the etch of the interconnect trough. The process includes the steps of: forming an insulating layer on the surface of a substrate; forming an etch stop layer on the surface of the insulating layer; forming an opening in the etch stop layer; etching to a first depth through the opening in the etch stop layer and into the insulating layer to form an interconnect trough; forming a photoresist mask on the surface of the etch stop layer and in the trough; and continuing to etch through the insulating layer until reaching the surface of the substrate to form a contact hole. The above process may be repeated one or more times during the formation of multilevel metal integrated circuits.

23 Claims, 5 Drawing Sheets

U.S. PATENT DOCUMENTS

| | | |
|---|---|---|
| 3,660,733 A | 5/1972 | Vilf et al. |
| 3,660,735 A | 5/1972 | McDougall |
| 3,728,167 A | 4/1973 | Garber |
| 3,904,454 A | 9/1975 | Magdo et al. |
| 3,961,414 A | 6/1976 | Humphreys |
| 4,030,967 A | 6/1977 | Ingrey et al. |
| 4,135,954 A | 1/1979 | Chang et al. |
| 4,243,435 A | 1/1981 | Barile et al. |
| 4,318,751 A * | 3/1982 | Horng .................. 438/374 |
| 4,377,438 A | 3/1983 | Moriya et al. |
| 4,671,849 A | 6/1987 | Chen et al. |
| 4,696,097 A | 9/1987 | McLaughlin et al. |
| 4,832,789 A | 5/1989 | Cochran et al. |
| 4,837,176 A | 6/1989 | Zdebel et al. |
| 4,883,767 A | 11/1989 | Gray et al. |
| 4,962,058 A | 10/1990 | Cronin et al. |
| 4,997,778 A * | 3/1991 | Sim et al. .................. 438/182 |
| 4,997,789 A | 3/1991 | Keller et al. |
| 5,055,423 A | 10/1991 | Smith et al. |
| 5,055,426 A | 10/1991 | Manning |
| 5,091,339 A | 2/1992 | Carey |
| 5,093,279 A | 3/1992 | Andreshak et al. |
| 5,106,780 A | 4/1992 | Higuchi |
| 5,126,006 A * | 6/1992 | Cronin et al. .............. 438/702 |
| 5,136,124 A | 8/1992 | Cronin et al. |
| 5,169,802 A | 12/1992 | Yeh |
| 5,173,442 A | 12/1992 | Carey |
| 5,189,506 A | 2/1993 | Cronin et al. |
| 5,204,286 A | 4/1993 | Doan |
| 5,206,187 A | 4/1993 | Doan et al. |
| 5,219,787 A | 6/1993 | Carey et al. |
| 5,258,328 A | 11/1993 | Sunada et al. |
| 5,294,561 A | 3/1994 | Tanigawa |
| 5,312,518 A | 5/1994 | Kadomura |
| 5,312,777 A | 5/1994 | Cronin et al. |
| 5,330,934 A | 7/1994 | Shibata et al. |
| 5,354,711 A | 10/1994 | Heitzmann et al. |
| 5,423,945 A | 6/1995 | Marks et al. |
| 5,612,254 A | 3/1997 | Mu et al. |
| 5,651,855 A | 7/1997 | Dennison et al. |
| 5,682,044 A | 10/1997 | Tamamushi et al. |
| 5,858,877 A | 1/1999 | Dennison et al. |
| 5,880,037 A | 3/1999 | Arleo |
| 6,221,779 B1 | 4/2001 | Dennison et al. |
| 6,399,514 B1 | 6/2002 | Marks et al. |
| 6,414,392 B1 | 7/2002 | Dennison et al. |
| 6,420,272 B1 | 7/2002 | Shen et al. |
| 6,573,601 B2 | 6/2003 | Dennison et al. |
| 6,617,253 B1 | 9/2003 | Chu et al. |
| 6,617,254 B2 | 9/2003 | Lee et al. |
| 6,689,696 B2 | 2/2004 | Lee et al. |
| 6,762,127 B2 | 7/2004 | Boiteux et al. |
| 6,806,203 B2 | 10/2004 | Weidman et al. |
| 6,812,150 B2 | 11/2004 | Zheng |
| 6,838,384 B2 | 1/2005 | Kamijima |
| 6,900,134 B1 | 5/2005 | Shih et al. |
| 6,927,120 B2 | 8/2005 | Hsu et al. |
| 6,927,170 B2 | 8/2005 | Zheng |
| 7,030,024 B2 | 4/2006 | Ho et al. |
| 2001/0046777 A1 | 11/2001 | Lee et al. |
| 2001/0051436 A1 | 12/2001 | Kim |
| 2002/0039840 A1 | 4/2002 | Watatani |
| 2003/0176058 A1 | 9/2003 | Weidman et al. |
| 2004/0043619 A1 | 3/2004 | Rhodes et al. |
| 2006/0057852 A1 | 3/2006 | Fu et al. |
| 2006/0199391 A1 | 9/2006 | Nakata |
| 2006/0234511 A1 | 10/2006 | Ohuchi |

FOREIGN PATENT DOCUMENTS

| | | |
|---|---|---|
| JP | 2-292818 | 12/1990 |
| JP | 2-292819 | 12/1990 |
| JP | 03-087030 | 4/1991 |
| JP | 03-230548 | 10/1991 |

PUBLICATIONS

IBM Technical Disclosure Bulletin, "Lithographic Patterns with a Barrier Liner," vol. 32, No. 10B, pp. 114-115, Mar. 1990.

Kaanta et al., "Dual Damascene: A ULSI Wiring Technology," VMIC Conference, pp. 144-152, Jun. 11-12, 1991.

Wolf, "Silicon Processing for the VLSI Era," vol. 2: Process Integration, pp. 51-54, 247-251, Lattice Press, Sunset Beach, California 1990.

Yeh et al., "Reverse pillar—a self-aligned and self-planarised metallisation scheme for sub-micron technology," Vacuum, vol. 38, No. 8-10, pp. 817-821, 1988.

Office Action (Reasons for Rejection) mailed Jan. 31, 1995, from Japanese Patent Office, for Japanese counterpart application No. 204434/93, with English translation and partial translation of cited references.

\* cited by examiner

METHOD FOR AN INTEGRATED CIRCUIT CONTACT

CROSS-REFERENCE TO RELATED APPLICATIONS

This application is a continuation of application Ser. No. 10/923,242, filed Aug. 19, 2004, now U.S. Pat. No. 7,276,448, issued Oct. 2, 2007, which is a divisional of application Ser. No. 10/136,544, filed May 1, 2002, now U.S. Pat. No. 7,282,440, issued Oct. 16, 2007, which is a continuation of application Ser. No. 09/569,578, filed May 10, 2000, now U.S. Pat. No. 6,414,392, issued Jul. 2, 2002, which is a divisional of application Ser. No. 09/099,047, filed Jun. 17, 1998, now U.S. Pat. No. 6,221,779, issued Apr. 24, 2001, which is a continuation of application Ser. No. 08/786,482, filed Jan. 21, 1997, now U.S. Pat. No. 5,858,877, issued Jan. 12, 1999, which is a continuation of application Ser. No. 08/626,651, filed Apr. 1, 1996, now U.S. Pat. No. 5,651,855, issued Jul. 29, 1997, which is a continuation of application Ser. No. 08/259,187, filed Jun. 13, 1994, abandoned, which is a continuation-in-part of application Ser. No. 07/921,320 filed Jul. 28, 1992, abandoned. The disclosure of each of the previously referenced U.S. patent applications and patents referenced is hereby incorporated by reference in its entirety.

BACKGROUND OF THE INVENTION

Field of the Invention: This invention relates generally to processes for manufacturing ultra large scale integrated circuits (ULSICs) and more particularly to a self-aligned process for simultaneously enhancing the achievable device packing density, device reliability and yields during such manufacture.

In the manufacture of ultra large scale integrated circuits, such as 4-megabit and up dynamic random access memories (DRAMs), it has been one prior art approach to use an inlaid, fully integrated wiring technology known in the integrated circuit manufacturing arts as "Dual Damascene" technology. This approach to ULSIC electrical contact development is described in some detail in Cronin, et al., U.S. Pat. No. 5,126,006 and in an article by Carter W. Kaanta, et al. entitled "Dual Damascene: A ULSIC Wiring Technology," IBM General Technology Division, Essex Junction, VT, VMIC Conference, Jun. 11-12, 1991, at pp. 144-152.

This Dual Damascene processing for etching troughs through insulating layers formed on silicon substrates utilizes, among other things, first and second successive etching steps in order to arrive at an ultimate trough and contact hole geometry within surrounding insulating layers formed on the surface of a silicon wafer. The first etch step forms the trough down to a controlled depth within the surface insulating layers. The second etch step extends the depth of the trough down to the active devices within the silicon substrate to form the contact hole. One disadvantage of using the above described Dual Damascene approach is that the photoresist etch mask required for the second etch step must be precisely aligned with respect to the trough opening formed by the first etch step. The requirement for precise alignment of the second etch mask imposes an upper threshold on the maximum achievable packing density, reliability and yields that can be reached using the above Dual Damascene process. In addition, present techniques do not allow the etch of the interconnect trough to be controlled independent of the etch of the stud or contact hole.

It is the solution to these problems to which the present invention is directed.

BRIEF SUMMARY OF THE INVENTION

In accordance with the present invention, it has been discovered that the above problem of precise second etch mask alignment with respect to the first formed trough opening can be significantly reduced by the employment of an etch stop layer on the surface of the insulating layer. The width dimension of an opening in the etch stop layer is made coextensive with the width dimension of the desired trough opening to be formed within the insulating layer. Then, the etch stop layer is used in combination with an etchant to define the trough opening within the insulating layer. Next, a photoresist etch mask is formed on the surface of the etch stop layer and has an opening therein defined by predetermined width and length dimensions dependent upon the desired trough geometry. However, since the photoresist mask is formed above the etch stop layer, the alignment of its width dimension is not now critical inasmuch as the etching action for increasing the depth of a portion of the trough to complete formation of the stud or contact hole is confined, or self-aligned, by the opening in the etch stop layer. Thus, as this second etching step of the insulating layer continues on to the silicon substrate surface, its width dimension remains constant. Also, because the interconnect trough is completely formed in the first etch, the trough can be and is masked during the second etch that forms the stud or contact hole. The etch that forms the contact hole can, therefore, be controlled independent of the etch that forms the trough.

Next, the photoresist mask is removed and the completed trough and contact hole are filled with a selected metal such as tungsten. Finally, and optionally, the etch stop layer can be either retained in place or removed and the tungsten layer is chemically and mechanically polished using known CMP processes back to a depth substantially coplanar with the surface of the etch stop layer when the etch stop layer is retained in place. Optionally, surface contact pads may be formed on top of the completed metal pattern. Also optionally, the etch stop layer removal step can be carried out prior to the tungsten deposition step, and blanket etching of metal can be used instead of CMP processes.

Accordingly, it is an object of the present invention to provide a new and improved self-aligning process for making electrical contacts in the manufacture of high density integrated circuits.

Another object of this invention is to provide a new and improved process of the type described which represents a novel alternative with respect to the above described Dual Damascene process.

Another object of this invention is to provide a new and improved process of the type described which operates to increase maximum achievable device packing density in the manufacture of integrated circuits.

Another object of this invention is to provide a new and improved electrical contact-forming process of the type described which enhances device reliability and device yields.

Another object of this invention is to provide a new and improved process of the type described which may be repeated through a plurality of stacked dielectric layers such as $SiO_2$ to thereby form a multilevel metal integrated circuit.

Briefly summarized, and commensurate in scope with the broad claims filed herein, the present process of forming electrical contacts in the manufacture of integrated circuits includes the steps of: forming an insulating layer on the surface of a silicon substrate; forming an etch stop layer on the surface of the insulating layer; forming an opening in the etch stop layer; etching through the opening to a first trough depth into the insulating layer exposed by the opening in the etch stop layer; forming a photoresist etch mask on the surface of the etch stop layer and in a portion of the trough; continuing to etch the exposed portion of the insulating layer until reaching the surface of the silicon substrate to thereby form the contact or stud hole; removing the photoresist mask; and filling the trough and hole thus formed with a selected metal such as tungsten. In a preferred embodiment of the invention, chemical-mechanical polishing processes are used to remove a portion of the selected metal back to a depth coplanar with the surface of the etch stop layer or surface of the insulating layer.

The above brief summary of the invention, together with its attendant objects, advantages and novel features will become better understood with reference to the following description of the accompanying drawings.

DETAILED DESCRIPTION OF THE INVENTION

Figure 1:
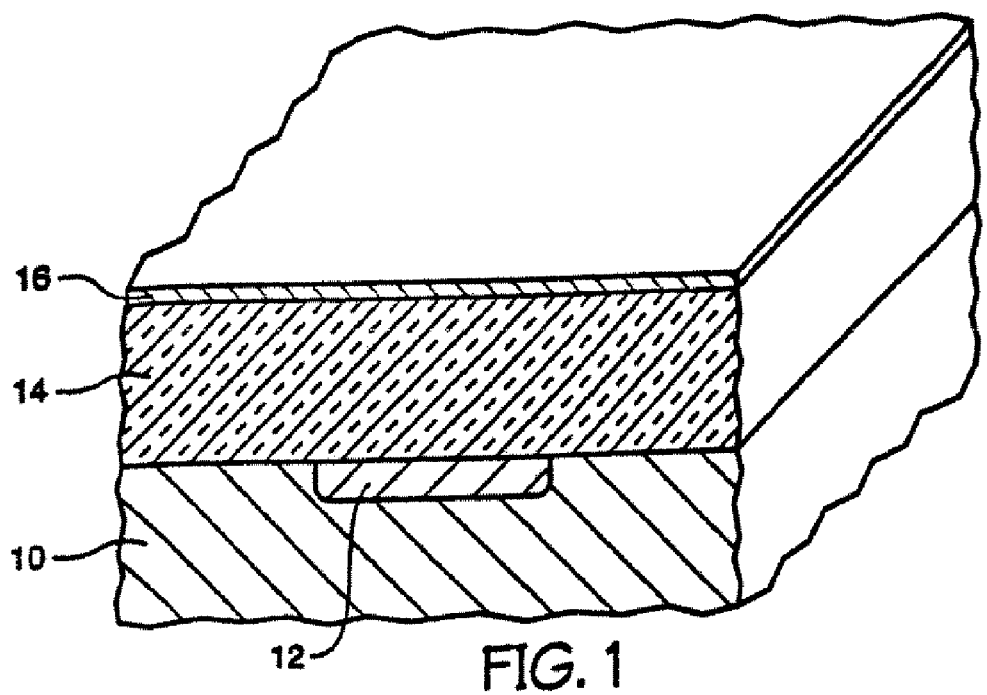
FIGS. 1 through 10 are a series of schematic cross-sectional diagrams illustrating the sequence of process steps used in a preferred process embodiment of the invention.

Referring now to FIG. 1, there is shown a silicon substrate 10 in which one or more active device regions 12 have been formed using conventional diffusion or ion implantation doping techniques together with conventional photolithographic masking and etching procedures. Typically, a relatively insulating layer 14, preferably made of silicon dioxide, will be formed on the surface of the silicon substrate 10 using low temperature chemical vapor deposition processes and preferably a known tetraethylorthosilicate (TEOS) process. Next, a thin etch stop layer 16 is formed to a thickness of about 500-1000 angstroms on the surface of the insulating layer 14. Etch stop layer 16 may be made of any suitable material such as silicon nitride, $Si_3N_4$, or titanium oxide, TiO, or aluminum oxide, $Al_2O_3$.

Figure 2:
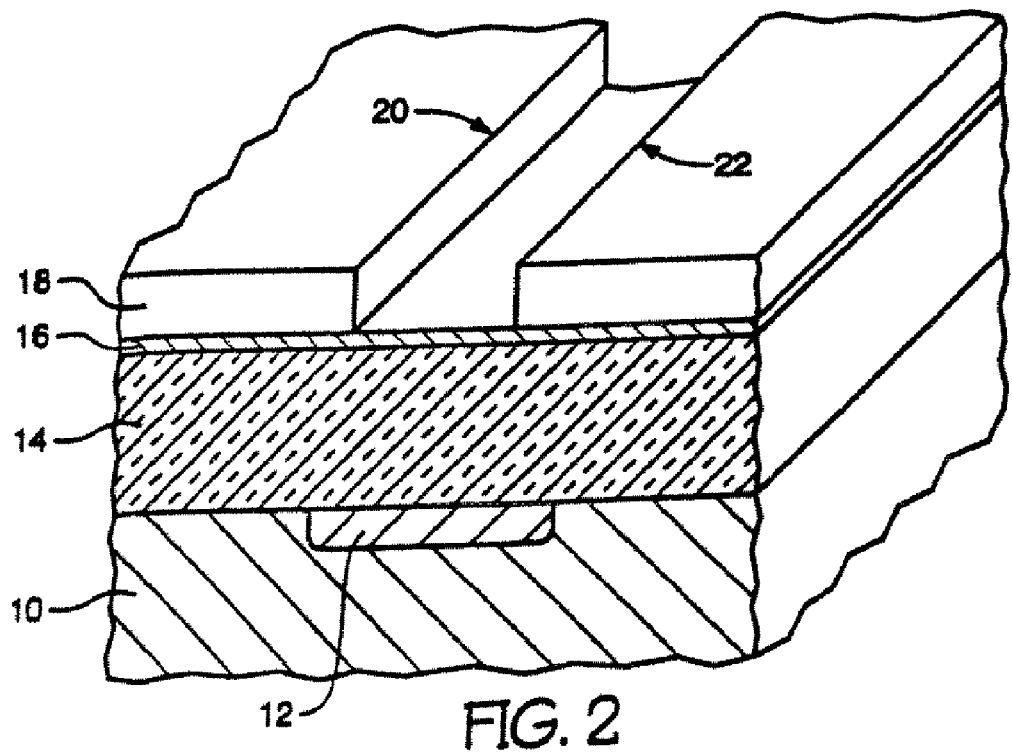
Figure 3:
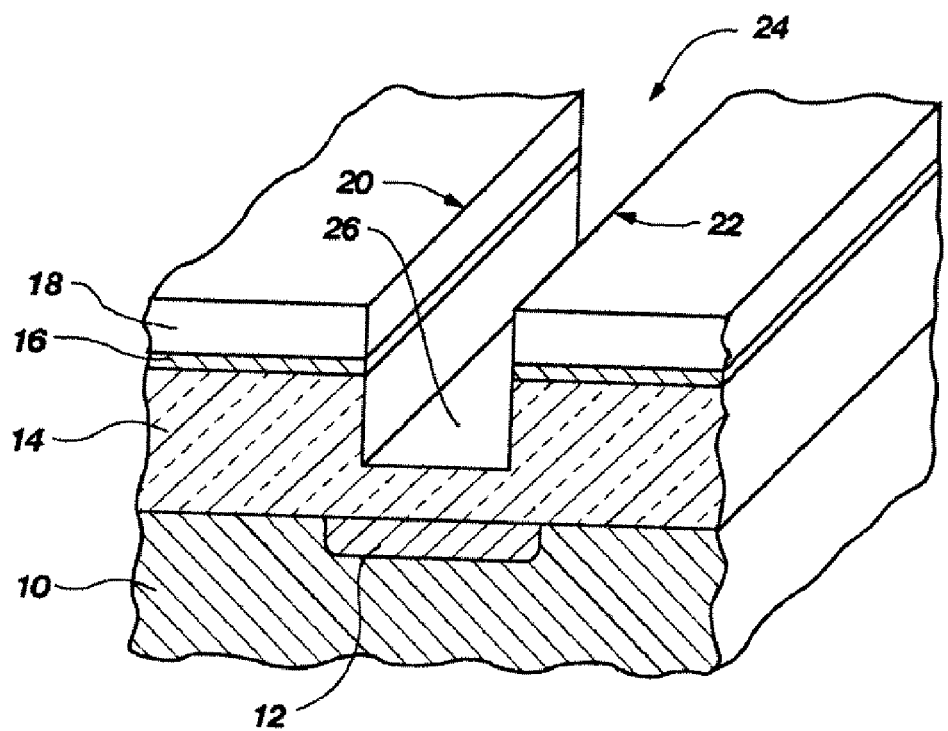
Figure 4:
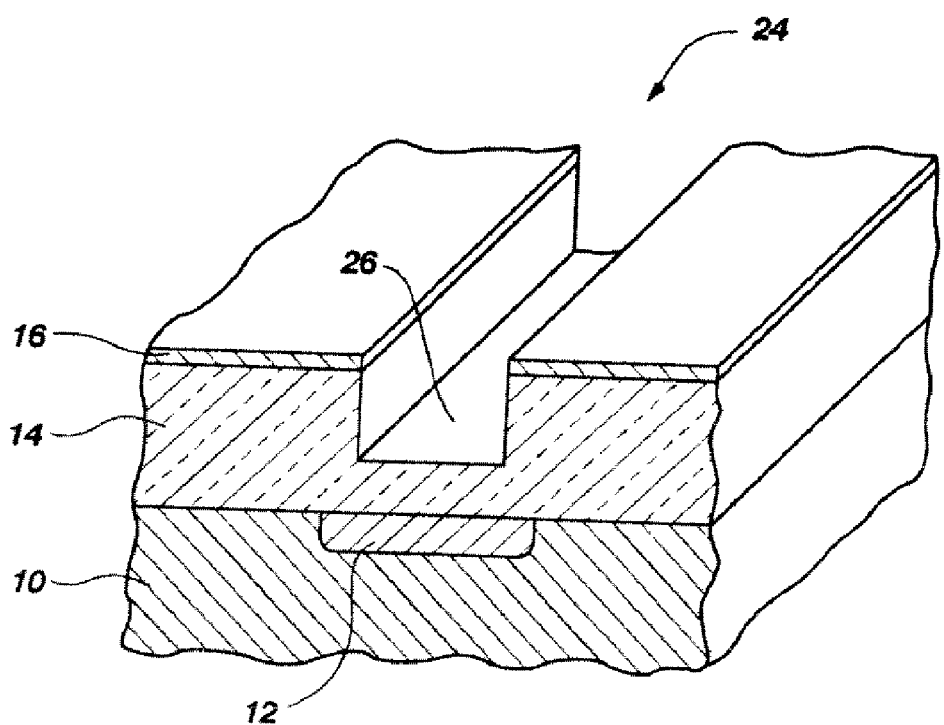

An opening is then formed in etch stop layer 16 to expose portions of insulating layer 14 at locations of desired trough patterns. In the preferred embodiment, and referring now to FIG. 2, a first photoresist mask 18 is formed on the surface of the etch stop layer 16, and an opening 20 is formed in the first photoresist mask 18 using conventional photolithographic masking and etching procedures in order to expose a given area 22 of the etch stop layer 16. Then, as shown in FIG. 3, an opening 24 is first etched in the etch stop layer 16 using an etchant such as $CHF_3$ and $CF_4$, and the first photoresist mask 18 in FIG. 3 may be left in place during etching down to a first desired depth to form trough 26 within the insulating layer 14. Once the trough 26 depth has been reached, then the first photoresist mask 18 in FIG. 3 is removed as shown in FIG. 4. The etch stop layer 16 of either silicon nitride, titanium oxide, aluminum oxide or other equivalent dense inorganic insulating material will be quite suitable to serve as an etch mask during the etching of the insulating layer 14 in the geometry shown in FIGS. 3 and 4.

Figure 5:
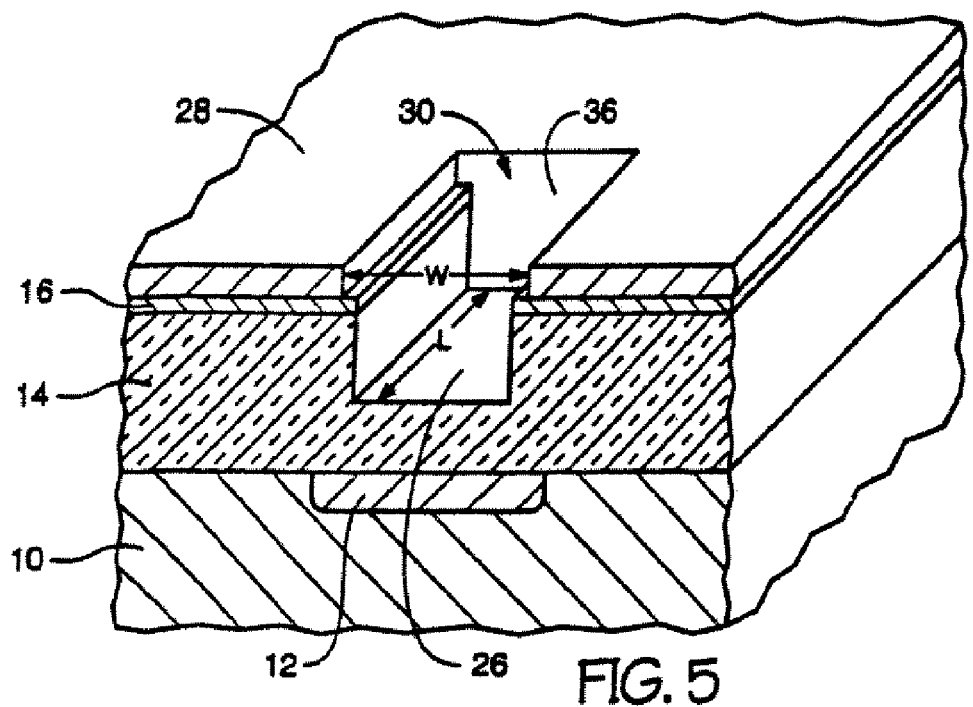
Figure 6:
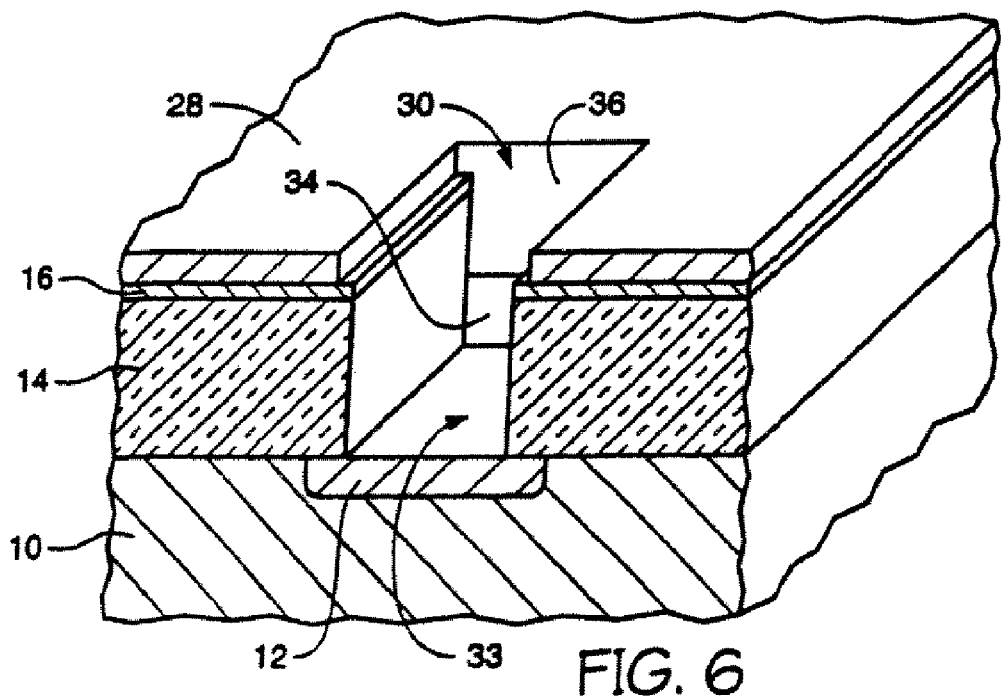

Referring now to FIG. 5, a second photoresist mask 28 having an opening 30 therein is formed on the surface of the etch stop layer 16. This second photoresist mask 28 will serve to mask against etching carried out using state of the art reactive ion etching (RIE) techniques. Opening 30 in second photoresist mask 28 has a width dimension, W, and need not be precisely aligned with the corresponding width dimension of the trough 26 opening because, during this etching process, etch stop layer 16 will serve to mask against the vertical ion bombardment except in the region of the trough 26. Such ion bombardment and etching will continue etching through the $SiO_2$ insulating layer 14 until reaching the active device region 12 to thereby produce the contact hole 33 indicated in FIG. 6. As seen in FIG. 6, the length dimension of the contact hole 33 extends to a back wall 34 of the insulating layer 14, and this back wall 34 is aligned with a back wall 36 of the second photoresist mask 28 (See FIG. 5.)

Figure 7:
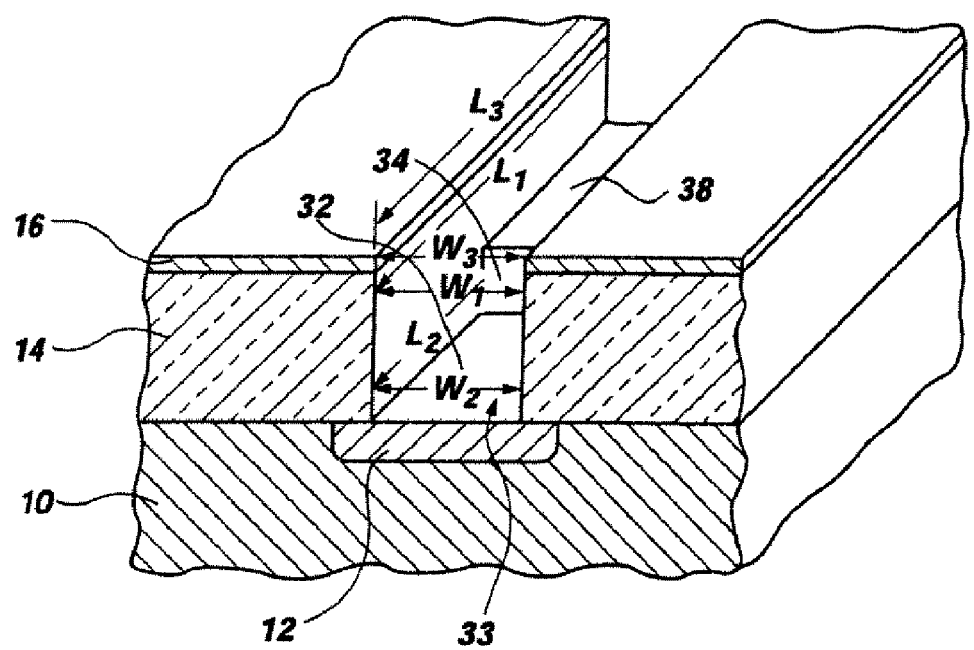

Referring now to FIG. 7, the second photoresist mask 28 in FIG. 6 has been removed to show the completed trough and hole geometry consisting of a first depth at top wall 38 which extends into the device structure of FIG. 7 along the length of the top wall 38 and the second greater depth at exposed surface 32. There is no criticality of mask alignment of the width dimension W of the second photoresist mask 28 with the width dimension of the vertical trough 26 being etched. However, the alignment of the contact hole 33 length dimension as defined by the back wall 36 of the second photoresist mask 28 in FIG. 6 still remains critical to defining the precisely desired device geometries for the integrated circuits being manufactured. It should be noted that, as illustrated, the insulating layer 14 has a first opening having a first length $L_1$ and a first width $W_1$, a second opening connected to the first opening located therebelow having a second length $L_2$ which is less than the length $L_1$ and a second width $W_2$ which is one of at least equal to the first width $W_1$ of the first opening and greater than the first width $W_1$ of the first opening. Further, the etch stop layer 16 located over the insulating layer 14 has a third opening which is located above the first opening in the insulating layer 14 and connected to the first opening having a third length $L_3$ at least equal to the first length $L_1$ of the first opening in the insulating layer 14 and a third width $W_3$ being one of at least equal to the first width $W_1$ of the first opening of the insulating layer 14 and greater than the first width $W_1$ of the first opening in the insulating layer 14.

Figure 8:
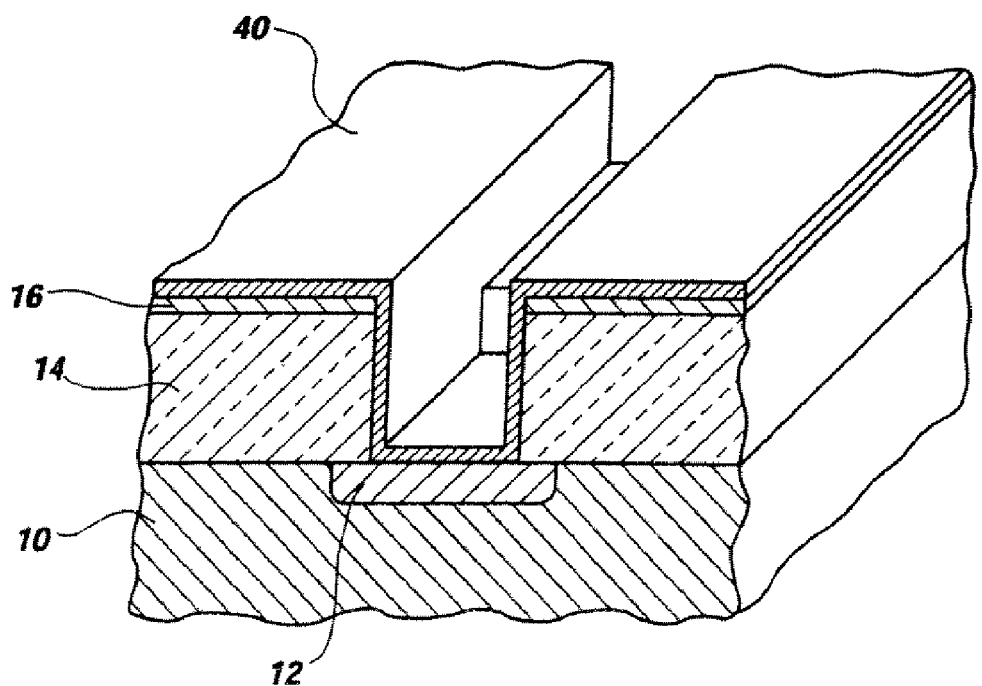
Figure 9:
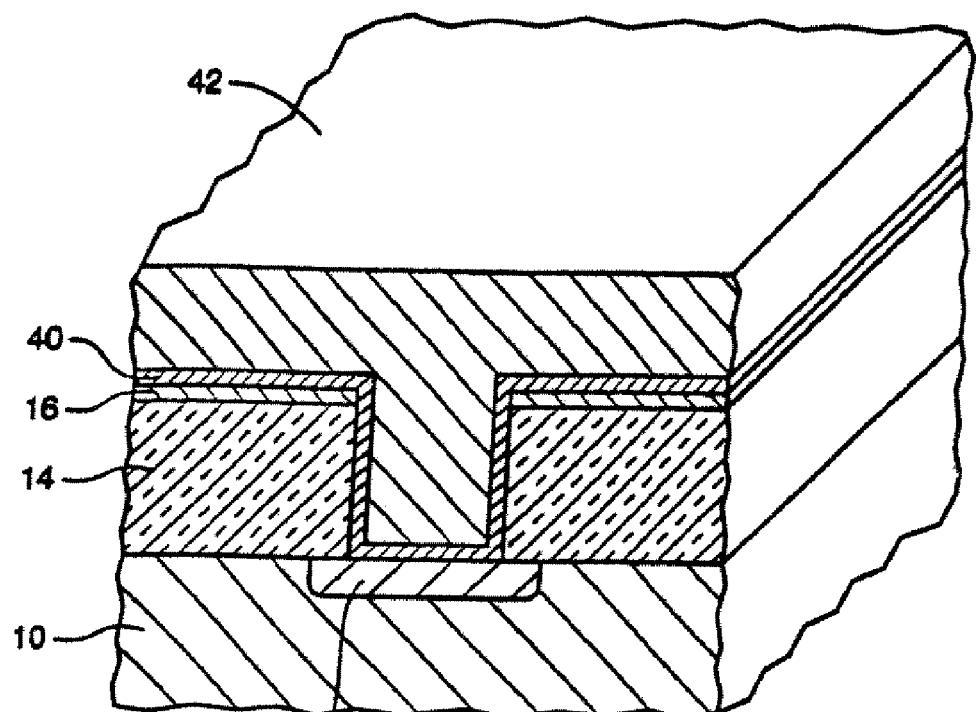
Figure 10:
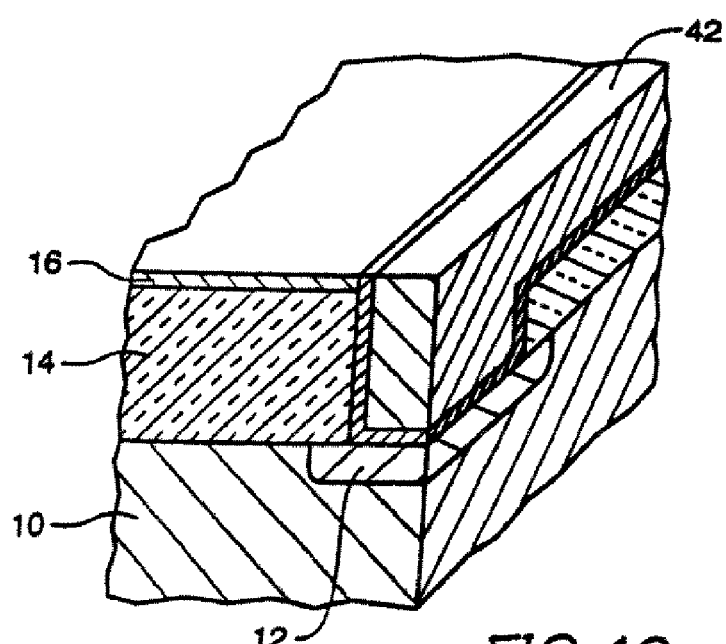

Referring now to FIG. 8, the exposed surface 32 and top wall 38 in FIG. 7 and the top surfaces of the etch stop layer 16 are covered with adhesion layer 40, and then as shown in FIG. 9, a metal layer 42 is deposited on the outer surface of the adhesion layer 40. This metal layer 42 will preferably be tungsten, copper or silver which is laid down using conventional metal deposition processes. Adhesion layer 40, preferably made of titanium nitride, is sputter deposited on insulating layer 14 and etch stop layer 16 to improve bonding with metal layer 42. Frequently, it will be desired to then polish or etch back metal layer 42 so that the ultimate top surface of the selected metal layer 42 is coplanar with the top surface of the etch stop layer 16 as shown in FIG. 10.

Optionally, the etch stop layer 16 can be used as a mask during etching of the metal layer 42 so that the metal layer 42 can be etched through opening 24 in etch stop layer 16 down to and coplanar with the top surface of insulating layer 14. Etch stop layer 16 would then be removed. The etch stop layer 16 may also be removed prior to forming the adhesion and metal layers 40 and 42, respectively. Also optionally, surface contact pads or interconnects (not shown) may be made on top of or leading into the planarized metallization-filled troughs described above.

Various modifications may be made in and to the above described embodiment without departing from the spirit and scope of this invention. For example, the present invention is in no way limited by the particular materials or layer thicknesses described above which are only exemplary of certain typical materials and layer thicknesses used in existing ULSIC semiconductor fabrication processes. In addition, the etch stop layer may be either removed or retained in place after the vertical trough forming process has been completed. Furthermore, the present invention is not limited to the electrical interconnection through a single layer of dielectric material, e.g., SiO$_2$, as shown in FIG. 10 and may instead be used in various types of multilevel metallization processes such as those shown, for example, in U.S. Pat. No. 5,204,286 of Trung T. Doan entitled "Method of Making Self-Aligned Contacts and Vertical Interconnects to Integrated Circuits and Devices Made Thereby," assigned to the present assignee and incorporated herein by reference. Accordingly, these and other process and device modifications are clearly within the scope of the following appended claims.

What is claimed is:

1. A method for forming a portion of a circuit comprising:
   forming a layer as part of the circuit in a device;
   forming a trough in the layer using an etch controlled by a first photoresist mask on the layer using a first set of etching parameters, the trough having a bottom and side walls forming a width dimension of the trough; and
   forming a contact hole under the trough using an etch controlled by a second photoresist mask applied to a portion of the circuit in the device free of alignment of the second photoresist mask to the width dimension of the trough, the second photoresist mask having a width dimension of an opening therein being larger than the width dimension of the trough so that the second photoresist mask is free of having a portion thereof from extending into a portion of the trough, and controlled by using an etch stop layer formed on a portion of the circuit in the device, the contact hole formed using a second set of etching parameters for use with a second photoresist mask.

2. The method of claim 1, wherein forming the contact hole comprises forming a contact hole under the trough without directly using the first photoresist mask.

3. The method of claim 1, further comprising defining a trough-shaped opening in the etch stop using the etch controlled by the first photoresist mask.

4. The method of claim 2, wherein forming the contact hole comprises forming the contact hole in the layer.

5. A method for forming a portion of a circuit comprising:
   using at least one patterned mask to form a trough within an oxide and a layer on a substrate during an etch using a first set of etching parameters for use with a first resist mask over the oxide and the layer, the trough having side walls forming a width dimension for the trough;
   using at least another patterned mask to form a stud hole under the trough during an etch using a second set of etching parameters for use with a second resist mask over the oxide and the layer of the circuit, the another patterned mask free of alignment with respect to the width dimension for the trough of the substrate when the another patterned mask is applied to the substrate, the another patterned mask having a width dimension of an opening therein being larger than the width dimension of the trough so that the second resist mask is free of having a portion thereof from extending into a portion of the trough;
   determining the second set of etching parameters for use with the another patterned mask after removing the first resist mask; and
   retaining at least a portion of one of the first resist mask and the second resist mask in a completed version of the semiconductor circuit.

6. A method for forming a portion of a circuit comprising:
   forming a trough having side walls for a width dimension for the trough in a layer using an etch controlled by a first photoresist mask using a first set of etching parameters for the portion of the circuit; and
   forming a contact hole under the trough using an etch controlled by a second photoresist mask applied to a portion of the circuit free of alignment of the second photoresist mask using the width dimension of the trough in the portion of the circuit, the second photoresist mask having the width dimension of an opening therein being larger than the width dimension of the trough so that the second photoresist mask is free of having a portion thereof from extending into a portion of the trough, and controlled by an etch stop formed on a portion of the circuit device using a second set of etching parameters for use with the second photoresist mask, the second set of etching parameters determined after removing the first photoresist mask.

7. The method of claim 6, wherein forming the contact hole comprises forming a contact hole under the trough without directly using the first photoresist mask.

8. The method of claim 7, wherein forming the contact hole comprises forming a contact hole in the layer.

9. An alignment method for fabricating portions of a semiconductor circuit, comprising:
   using at least one patterned mask to pattern a first resist mask to form a trough within an oxide during an etch using a first set of etching parameters for use with the at least one patterned mask over a layer of the semiconductor circuit, the layer used for aligning any further holes in the oxide;
   using at least one other differently patterned mask to pattern a second resist mask applied to portions of the semiconductor circuit to form a stud hole under the trough during an etch, the at least one other differently patterned mask having a width dimension of an opening therein being larger than a width dimension of an opening in the at least one patterned mask so that the at least one other differently patterned mask is free of having a portion thereof from extending into a portion of the trough and using at least one other set of etching parameters for use with the at least one other differently patterned mask, one of the first resist mask and the second resist mask applied to a substrate having the semiconductor circuit thereon, the at least one other set of etching parameters determined after removing the at least one patterned mask; and
   retaining at least a portion of one of the first resist mask and the second resist mask in a completed version of the semiconductor circuit.

10. A method for forming a portion of a circuit device having at least a portion of a layer, comprising:
    determining a first set of etching parameters for use with a first photoresist mask over at least the portion of the layer of the circuit device;
    forming a trough having the side walls thereof determining a width dimension in the layer using an etch controlled by the first photoresist mask using a first set of etching parameters for use with the first photoresist mask, the layer used to align subsequently formed holes; and
    forming a contact hole under the trough using an etch controlled by a second photoresist mask applied to the portion of the layer of the circuit device free of alignment to the width dimension of the trough, the second photoresist mask having the width dimension of an opening therein being larger thatn the width dimension of the trough so that the second photoresist mask is free of having a protion thereof from extending into a portion of the trough, and controlled by the layer as an etch stop formed on the circuit device using a second set of etching parameters for use with a second photoresist mask, the second set of etching parameters determined after removing the first photoresist mask.

11. The method of claim 10, wherein forming the contact hole comprises forming a contact hole under the trough without directly using the first photoresist mask.

12. The method of claim 10, further comprising defining a trough-shaped opening in the layer used as an etch stop using the etch controlled by the first photoresist mask.

13. The method of claim 11, wherein forming the contact hole comprises forming a contact hole in the layer.

14. A method for fabricating at least a portion of a circuit, comprising:
    using at least two differently patterned masks applied to at least two resist masks applied to portions of the circuit form a stud hole under the trough, at least one patterned mask of the at least two differently patterned masks applied to one of the at least two resist masks used to form the trough having a width within an oxide during an etch using a first set of etching parameters over a layer of the circuit, a second differently patterned mask of the at least two differently patterned mask applied to a second resist mask applied to portions of the circuit to form the stud hole under the trough during an etch, the second differently patterned mask applied to the second resist mask having the width dimension of an opening therein being larger than the width dimension of the trough so that the second differently patterned mask is free of having a portion thereof from extending into a portion of the trough, the second differently patterned mask, the at least one other set of etching parameters determined after removing the first resist mask; and
    retaining a portion of a portion of one of the at least two resist marks formed by at least one of the at least two differently patterned masks in a completed version of the circuit.

15. A method of aligning portions of a circuit during the formation thereof comprising:
    forming a trough in a layer using an etch controlled by a first photoresist mask using a first set of etching parameters; and
    forming a contact hole under the trough using an etch controlled by a second photoresist mask applied to a portion of the circuit having the width dimension of an opening in the second photoresist mask being larger than the width dimension of the trough so that the second photoresist mask is free of having a portion thereof from extending into a portion of the trough and controlled by an etch stop formed on a portion of the circuit using a second set of etching parameters for use with a second photoresist mask, the second set of etching parameters determined after removing the first photoresist mask, the etch stop used to align the contact hole under the trough by allowing the second photoresist mask being applied without alignment to the trough.

16. The method of claim 15, wherein forming the contact hole comprises forming a contact hole under the trough without directly using the first photoresist mask.

17. The method of claim 15, further comprising defining a trough-shaped opening in the etch stop using the etch controlled by the first photoresist mask.

18. The method of claim 16, wherein forming the contact hole comprises forming a contact hole in the layer.

19. A method for forming a portion of a circuit comprising:
    forming a trough through a layer on a portion of the circuit on a substrate using an etch and a first photoresist mask, the trough having a bottom and side walls, the side walls forming a width dimension of the trough; and
    forming a contact hole through the bottom of the trough to a portion of the circuit using an etch controlled by a second photoresist mask having the width dimension of an opening in the second photoresist mask being larger than the width dimension of the trough so that the second photoresist mask is free of having a portion thereof from extending into a portion of the trough and controlled by using an etch stop, the second photoresist mask free of alignment to the width dimension of the trough, the contact hole formed using the second photoresist mask.

20. The method of claim 19, wherein forming the contact hole comprises forming a contact hole through a portion of the bottom of the trough.

21. The method of claim 19, further comprising defining a trough-shaped opening in the etch stop using the etch controlled by the first photoresist mask.

22. The method of claim 21, wherein forming the contact hole comprises forming the contact hole through the layer to a conductive material.

23. A method for forming a portion of a circuit comprising:
    applying an etch stop to a layer on a portion of the circuit on a substrate;
    applying a first photoresist mask to the etch stop;
    forming a trough through a portion of the layer using an etch, the trough having a bottom and side walls, the side walls forming a width dimension of the trough; and
    forming a contact hole through the bottom of the trough to a portion of the circuit using an etch controlled by a second photoresist mask, the second photoresist mask free of alignment to the width dimension of the trough having the width dimension of an opening in the second photoresist mask being larger than the width dimension of the trough so that the second photoresist mask is free of having a portion thereof from extending into a portion of the trough.

* * * * *

UNITED STATES PATENT AND TRADEMARK OFFICE
CERTIFICATE OF CORRECTION

PATENT NO. : 7,871,934 B2
APPLICATION NO. : 11/841906
DATED : January 18, 2011
INVENTOR(S) : Charles H. Dennison and Trung T. Doan Page 1 of 1

It is certified that error appears in the above-identified patent and that said Letters Patent is hereby corrected as shown below:

Column 5, line 1, "trough forming" should read --trough-forming--.
Column 5, line 33, "The method of" should read --The method in--.
Column 5, line 36, "The method of" should read --The method in--.
Column 5, line 39, "The method of" should read --The method in--.
Column 6, line 17, "The method of" should read --The method in--.
Column 6, line 20, "The method of" should read --The method in--.
Column 6, line 66, "having a protion" should read --having a portion--.
Column 7, line 5, "The method of" should read --The method in--.
Column 7, line 8, "The method of" should read --The method in--.
Column 7, line 11, "The method of" should read --The method in--.
Column 7, line 16, after "circuit" insert the word --to--.
Column 7, line 17, "under the trough" should read --under a trough--.
Column 7, line 26, "second resit" should read --second resist--.
Column 7, line 31, "patterned mask, the" should read --patterned mask using--.
Column 7, line 32, after "parameters" insert --for use with the at least two differently patterned masks, the at least one other set of etching parameters--.
Column 7, line 34, delete "of a portion".
Column 7, line 35, "marks" should read --masks--.

Signed and Sealed this
Twentieth Day of March, 2012

David J. Kappos
*Director of the United States Patent and Trademark Office*